United States Patent
Chou et al.

(10) Patent No.: US 8,461,647 B2
(45) Date of Patent: Jun. 11, 2013

(54) SEMICONDUCTOR DEVICE HAVING MULTI-THICKNESS GATE DIELECTRIC

(75) Inventors: Hsueh-Liang Chou, Jhubei (TW); Ruey-Hsin Liu, Hsin-Chu (TW); Chih-Wen Yao, Hsinchu (TW); Hsiao-Chin Tuan, juDong County (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 365 days.

(21) Appl. No.: 12/721,045

(22) Filed: Mar. 10, 2010

(65) Prior Publication Data

US 2011/0220995 A1    Sep. 15, 2011

(51) Int. Cl.
 *H01L 29/66* (2006.01)
(52) U.S. Cl.
 USPC ........... 257/335; 257/337; 257/E29.256; 257/E21.417; 438/287; 438/591
(58) Field of Classification Search
 USPC .......... 257/335, 337, E29.027, E29.256, 257/E21.417; 438/287, 591
 See application file for complete search history.

(56) References Cited

U.S. PATENT DOCUMENTS

| | | | |
|---|---|---|---|
| 6,333,234 B1 | 12/2001 | Liu | |
| 6,441,431 B1 * | 8/2002 | Efland et al. | 257/335 |
| 7,683,427 B2 * | 3/2010 | Chen et al. | 257/343 |
| 2005/0073007 A1 * | 4/2005 | Chen et al. | 257/355 |
| 2008/0217693 A1 | 9/2008 | Wang et al. | |
| 2008/0246083 A1 | 10/2008 | Tien et al. | |
| 2008/0265292 A1 | 10/2008 | Huang et al. | |
| 2009/0008711 A1 | 1/2009 | Wei et al. | |
| 2009/0072308 A1 | 3/2009 | Chen et al. | |

OTHER PUBLICATIONS

Chinese Patent Office, Office Action dated Oct. 9, 2012, Application No. 201010207330.x, 7 pages.

* cited by examiner

*Primary Examiner* — Matthew Landau
*Assistant Examiner* — Colleen E Snow
(74) *Attorney, Agent, or Firm* — Haynes and Boone, LLP

(57) ABSTRACT

A semiconductor device is provided that, in an embodiment, is in the form of a high voltage MOS (HVMOS) device. The device includes a semiconductor substrate and a gate structure formed on the semiconductor substrate. The gate structure includes a gate dielectric which has a first portion with a first thickness and a second portion with a second thickness. The second thickness is greater than the first thickness. A gate electrode is disposed on the first and second portion. In an embodiment, a drift region underlies the second portion of the gate dielectric. A method of fabricating the same is also provided.

13 Claims, 4 Drawing Sheets

US 8,461,647 B2

SEMICONDUCTOR DEVICE HAVING MULTI-THICKNESS GATE DIELECTRIC

BACKGROUND

The present disclosure relates generally to semiconductor technology, and more particularly, to a semiconductor device having a gate dielectric with multiple thicknesses, and a method of fabricating the same.

High voltage metal-oxide-semiconductor (HVMOS) devices have many applications including CPU power supplies, power management systems, AC/DC converters and the like. As semiconductor circuits composed of devices such as metal-oxide-semiconductor field effect transistors (MOSFETs) are adapted for high voltage applications, problems arise with respect to their reliability. For example, a high gate current can degrade the devices reliability. Methods of reducing the gate current injected such as reducing the drift region doping and modifying device dimensions can lead to other issues such as increasing the turn-on resistance of the device. Therefore, what is needed is a reliable HVMOS device and method of making the same.

SUMMARY

One of the forms of an embodiment of the present invention involves a semiconductor device. The semiconductor device includes a semiconductor substrate. A gate structure is formed on the semiconductor substrate. The gate structure includes a gate dielectric and an overlying gate electrode. The gate dielectric has a first portion with a first thickness and a second portion with a second thickness. The second thickness is greater than the first thickness. A source and a drain are formed in the substrate on either side of the gate structure. In an embodiment, the semiconductor device is a HVMOS device.

Yet another one of the forms of an embodiment of the present invention involves a high voltage semiconductor device. The high voltage semiconductor device includes a substrate of a first conductivity type and a buried layer, of a second conductivity type, disposed on the substrate. A first high voltage well having the second conductivity type is disposed on the substrate above the buried layer and a second high voltage well having the first conductivity type also disposed on the substrate above the buried layer. A drain region is disposed in the first high voltage well and a source region is disposed in the second high voltage well. A gate structure is provided on the substrate which includes a gate dielectric layer and a gate electrode layer. The gate dielectric layer has a first region having a first thickness and a second region having a second thickness greater than the first thickness. The second region may overlie the first high voltage well.

Another one of the forms of an embodiment of the present invention involves a method for fabricating a semiconductor device. An embodiment of the method includes providing a semiconductor substrate and forming a gate dielectric layer structure on the semiconductor substrate. The gate dielectric layer is formed by patterning the gate dielectric layer to form a first region having a first thickness and a second region having a second thickness. The second thickness is greater than the first thickness. A gate electrode is then formed on the gate dielectric and at least one high voltage well is formed on the substrate underlying the gate electrode.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
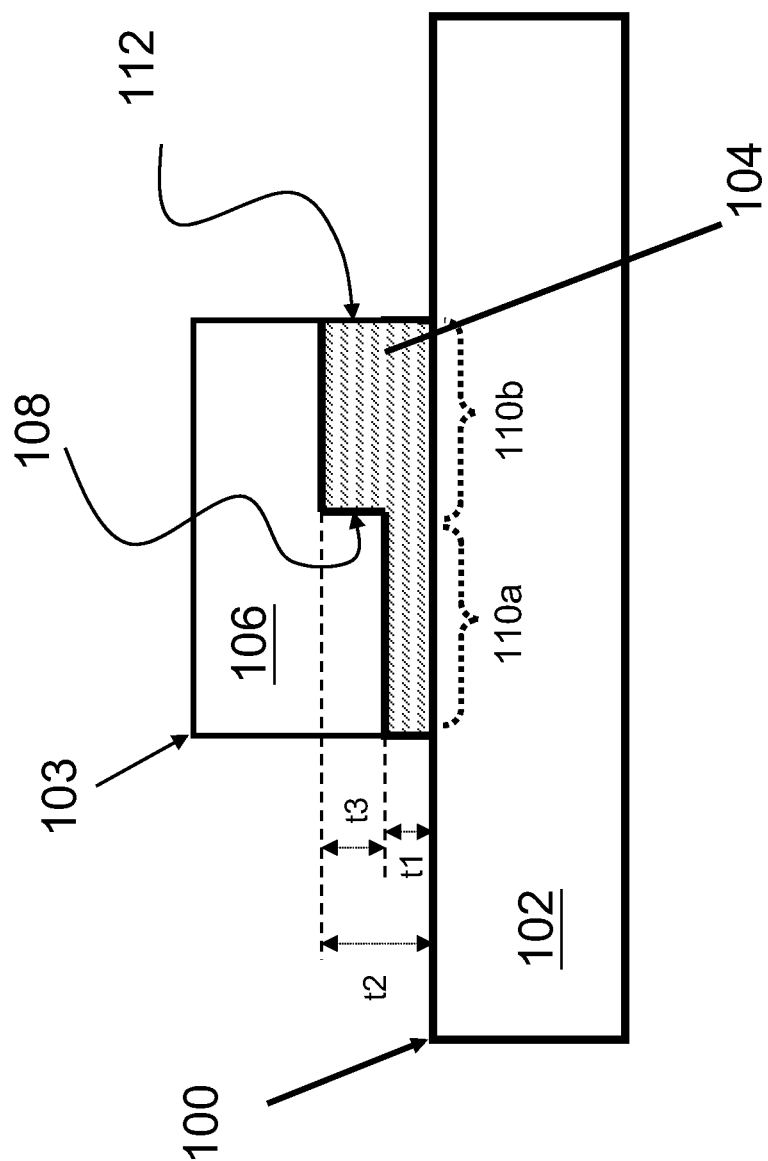
FIG. 1 is a cross-sectional view of an embodiment of a semiconductor device according various aspects of the present disclosure.

The present disclosure relates generally to the field of semiconductor integrated circuits. It is understood that the following disclosure provides many different embodiments, or examples, for implementing different features of the invention. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact.

Certain embodiments described herein are illustrated as a particular type of semiconductor device. However, numerous other embodiments are possible. For example, the disclosure is applicable to complementary HVMOS devices (e.g., a high voltage NMOS transistor as well as a high voltage PMOS transistor). The disclosure is also applicable to various semiconductor devices. For example, power devices including HVMOS devices and various structures thereof (e.g., lateral diffused (LDMOS), extended-drain (EDMOS), vertical double-diffused (VDMOS), double-diffused drain (DDD) MOS devices). The embodiments described herein are exemplary only and not intended to be limiting.

FIG. 1 is a cross-section that illustrates an embodiment of a semiconductor device 100 according to various aspects of the present disclosure. In an embodiment, the semiconductor device 100 is an HVMOS device (n-type or p-type). The device 100 includes a substrate 102. The substrate 102 may include a semiconductor wafer such as a silicon wafer. Alternatively, the substrate 102 may include other elementary semiconductors such as germanium. The substrate 102 may also include a compound semiconductor such as silicon carbide, gallium arsenic, indium arsenide, and indium phosphide. The substrate 102 may include an alloy semiconductor such as silicon germanium, silicon germanium carbide, gallium arsenic phosphide, and gallium indium phosphide. In one embodiment, the substrate 102 includes an epitaxial layer (epi layer) overlying a bulk semiconductor. In further embodiments, the substrate 102 may include a semiconductor-on-insulator (SOI) structure. For example, the substrate may include a buried oxide (BOX) layer formed by a process such as separation by implanted oxygen (SIMOX).

The substrate 102 has various features formed thereon. For example, the substrate 102 may include features including doped regions such as a source region, a drain region, low-dosed source/drain regions; doped well regions such as p-type or n-type high voltage wells, highly doped and lightly doped wells; isolation regions such as shallow trench isolation (STI) or field oxide (FOX) regions or local oxidation of silicon (LOCOS); buried layers such as an n-type buried layer (NBL), a p-type buried layer (PBL); interconnections such as multiple layer interconnects (MLI) including metal lines, vias, and contacts; and/or other suitable features. One or more of the features may be implemented using a complementary metal oxide semiconductor (CMOS) technology.

A gate structure 103 is disposed on the substrate 102. The gate structure 103 may be physically and/or electrically coupled to one or more features described above. The gate structure 103 includes a gate dielectric 104 and a gate electrode 106 disposed on the gate dielectric 104. The gate electrode 106 may be configured to be coupled to metal interconnects (e.g., MLI). The gate electrode 106 may include a doped or non-doped polycrystalline silicon (or polysilicon). Alternatively, the gate electrode 106 may include a metal such as Al, Cu, W, Ti, Ta, TiN, TaN, NiSi, CoSi, other suitable conductive materials, or combinations thereof. The gate electrode 106 may be formed by chemical vapor deposition (CVD), physical vapor deposition (PVD), atomic layer deposition (ALD), plating, and/or other proper processes. Photolithography and/or etching steps may also be used to pattern the gate electrode. The gate electrode 106 may have a multilayer structure.

The gate dielectric 104 may include a silicon dioxide (referred to as silicon oxide) layer. Alternatively, the gate dielectric 104 may optionally include a high-k dielectric material, silicon oxynitride, other suitable materials, or combinations thereof. The high-k material may be selected from metal oxides, metal nitrides, metal silicates, transition metal-oxides, transition metal-nitrides, transition metal-silicates, oxynitrides of metals, metal aluminates, zirconium silicate, zirconium aluminate, $HfO_2$, or combinations thereof. The gate dielectric 104 may have a multilayer structure such as one layer of silicon oxide and another layer of high k material.

The gate dielectric 104 includes two regions or portions: a first region 110a and a second region 110b. The first region 110a includes a thickness t1. The second region 110b includes a thickness t2, which is greater than t1 by an amount designated t3. In an embodiment, the thickness t1 is approximately 130 Angstroms. Other example thicknesses for t1 range between about 10 Angstroms and about 200 Angstroms. The thickness t2 may be between approximately 200 Angstroms and 2000 Angstroms. In an embodiment, the difference in thicknesses t3 may range between approximately 50 Angstroms and 2000 Angstroms.

The gate dielectric 104 may be formed using chemical vapor deposition (CVD), physical vapor deposition (PVD), atomic layer deposition (ALD), thermal oxide, other suitable processes, and/or combinations thereof. The gate dielectric regions 110a and 110b may be defined using photolithography, etching, and/or other suitable processes to pattern the gate dielectric 104 as illustrated in FIG. 1. In an embodiment, the gate dielectric 104 may extend beyond the edge of the gate electrode 106. The dielectric layer 104 that is not underlying the gate electrode 106 may have a thickness of approximately t1.

The interface between the gate dielectric region 110a and the gate dielectric region 110b is defined by a step transition (or edge) 108. In an embodiment, as illustrated in FIG. 1, the edge 108 is substantially vertical (i.e., normal the surface of the substrate 102). The gate dielectric region 110b also includes a substantially vertical edge 112 defined by the edge of the gate electrode 106. Thus, FIG. 1 illustrates a gate dielectric region 110b having substantially vertical sidewalls.

Figure 2:
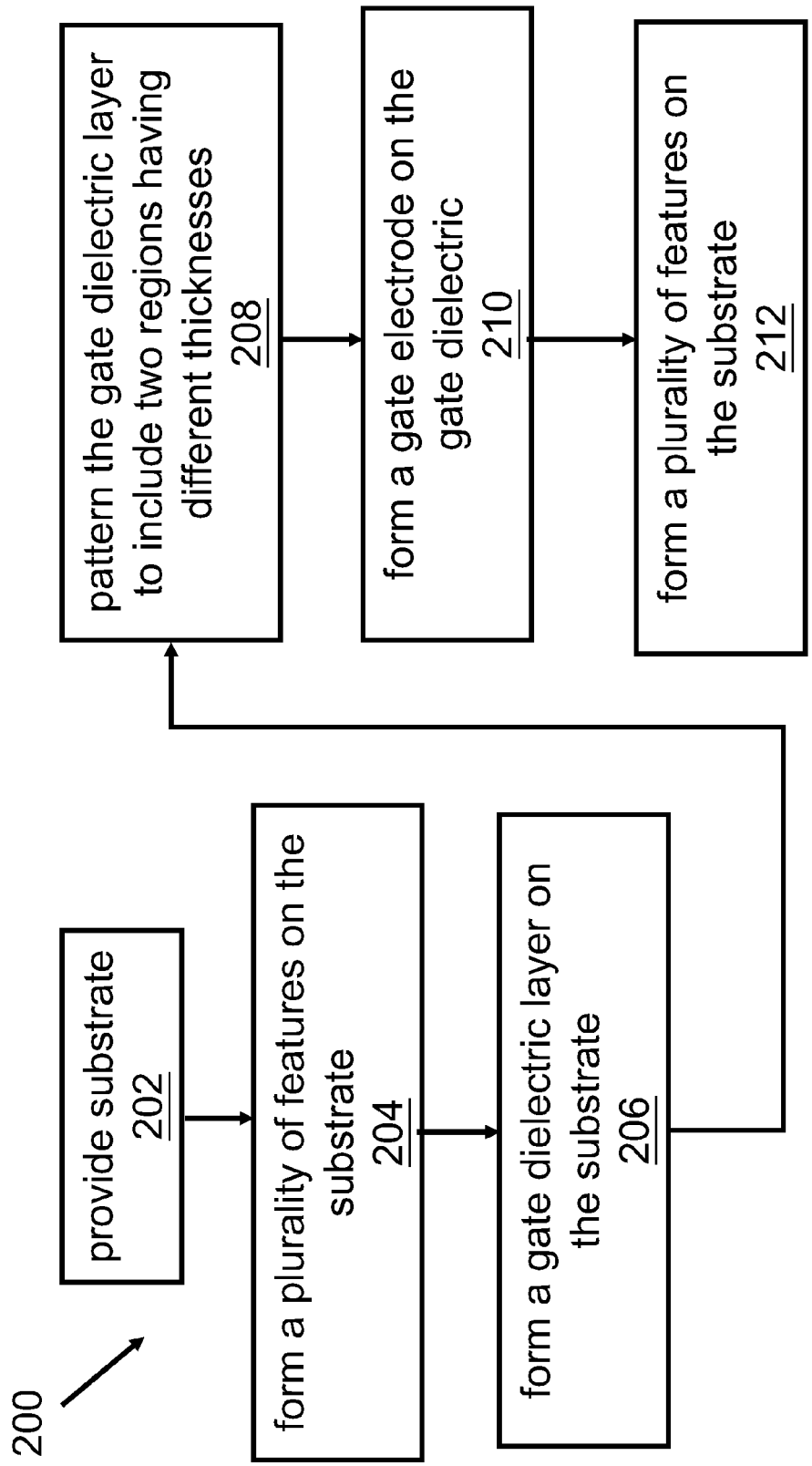
FIG. 2 is a flowchart of an embodiment of a method for fabricating a semiconductor device according to various aspects of the present disclosure.

Referring now to FIG. 2, illustrated is an embodiment of a method 200 for fabricating a semiconductor device according to various aspects of the present disclosure. It should be noted the method 200 may be implemented in a complementary metal oxide semiconductor (CMOS) technology process flow. Accordingly, it is understood that additional processes may be provided before, during, and after the method 200, and some processes may only be briefly described herein.

The method 200 may be used to fabricate the semiconductor device 100, or portion thereof. The method 200 begins at block 202 where a substrate is provided. The substrate may be substantially similar to the substrate 102 described above with reference to FIG. 1. The substrate may include a semiconductor wafer such as a silicon wafer. Alternatively, the substrate may include other elementary semiconductors such as germanium. The substrate may also include a compound semiconductor such as silicon carbide, gallium arsenic, indium arsenide, and indium phosphide. The substrate may include an alloy semiconductor such as silicon germanium, silicon germanium carbide, gallium arsenic phosphide, and gallium indium phosphide. In one embodiment, the substrate includes an epitaxial layer (epi layer) overlying a bulk semiconductor. Furthermore, the substrate may include a semiconductor-on-insulator (SOI) structure. For example, the substrate may include a buried oxide (BOX) layer formed by a process such as separation by implanted oxygen (SIMOX). In various embodiments, the substrate may include a buried layer such as an n-type buried layer (NBL) and/or a p-type buried layer (PBL). The substrate may be a p-type substrate or n-type substrate.

The method 200 then proceeds to block 204 where a plurality of features is formed on the substrate. The plurality of features may include features substantially similar to those features described above with reference to substrate 102 of FIG. 1.

In an embodiment, an isolation feature structure such as a shallow trench isolation (STI) structure may be formed in the substrate to define and electrically isolate various active regions. The formation of an STI structure may include dry etching a trench in a substrate and filling the trench with insulator materials such as silicon oxide, silicon nitride, or silicon oxynitride. The filled trench may have a multi-layer structure such as a thermal oxide liner layer filled with silicon nitride or silicon oxide. The STI structure may be created using a processing sequence such as patterning an STI opening using photoresist and masking, etching a trench in the substrate, optionally growing a thermal oxide trench liner to improve the trench interface, filling the trench with CVD oxide, and using chemical mechanical polishing (CMP) processing to etch back and planarize.

In an embodiment, a plurality of wells may be formed on the substrate. The wells may be of a first type of conductivity or a second type of conductivity (e.g., n-type or p-type doping). The wells may be a portion of the substrate, and may be formed by various ion implantation processes. One or more of the wells may be portions of an epitaxy layer such as a silicon epitaxy layer formed by epitaxy processing. An N-well may have an n-type dopant such as phosphorus or arsenic (As), and a P-well may have a p-type dopant such as boron. In one embodiment, the N-well and P-well may be formed by a plurality of processing steps such as growing a sacrificial oxide on substrate, opening a pattern for the location(s) of the well region, and implanting the impurities.

The method 200 continues with block 206 in which a gate dielectric layer (which will become part of a gate structure) is formed on the substrate. The gate dielectric may be substantially similar to the gate dielectric 104 described above with reference to FIG. 1. The gate dielectric may include a silicon dioxide (referred to as silicon oxide) layer. Alternatively, the gate dielectric may optionally include a high-k dielectric material, silicon oxynitride, other suitable materials, or combinations thereof. The gate dielectric may be formed using chemical vapor deposition (CVD), physical vapor deposition (PVD), atomic layer deposition (ALD), thermal oxidation, other suitable processes, and/or combinations thereof.

The method 200 then proceeds to block 208 where the gate dielectric layer is patterned to include a plurality of regions having different thicknesses. In an embodiment, the gate dielectric layer is patterned to provide a region having an increased thickness relative to other portions of the gate dielectric layer. For example, a portion of the gate dielectric layer having an increased thickness may be between approximately 200 Angstroms and approximately 2000 Angstroms in thickness. In an embodiment, the difference in thicknesses between the region having an increased thickness and one or more other regions of the dielectric layer may range between approximately 50 Angstroms and approximately 2000 Angstroms. The patterning may be performed by processes such as photolithography, etching, deposition, and/or other suitable processes. The patterning masks a portion of the gate dielectric layer, while a second portion is processed (e.g., increased in thickness). The gate dielectric layer may be patterned to provide a first region and a second region substantially similar to the regions 110a and 110b described above with reference to FIG. 1. In other embodiments, three or more regions of the gate dielectric are provided each with a differing thickness. In an embodiment, the gate dielectric is patterned (e.g., into regions having various thicknesses) by depositing a layer of photoresist on a formed dielectric layer (e.g., $SiO_2$) by a suitable process such as spin-on coating, and then patterned to form a patterned photoresist masking feature by a proper lithography patterning method. The pattern of the photoresist can then be transferred by an etching process to the underlying dielectric layer, in a plurality of processing steps and various proper sequences. In an embodiment, the process includes the use of a hard mask layer. The photoresist layer may be stripped thereafter. In an embodiment, the gate dielectric is patterned (e.g., into regions having various thicknesses) by depositing a layer of photoresist on a formed dielectric layer (e.g., $SiO_2$) by a suitable process, such as spin-on coating, and then patterning the resist to form a patterned photoresist masking feature by a proper lithography patterning method. The masking features can then be used to selectively form (e.g., through deposition or oxidation processes) additional dielectric (e.g., thicker layer) in a select area. The photoresist layer may be stripped thereafter. Other embodiments of formation of the gate dielectric layer having multiple thicknesses may be possible, now or in the future, which are within the scope of this disclosure.

The method 200 then proceeds to block 210 where a gate electrode is formed on the gate dielectric layer. The gate electrode may be substantially similar to the gate electrode 106, described above with reference to FIG. 1. The gate electrode may include a doped or non-doped polycrystalline silicon (or polysilicon). Alternatively, the gate electrode layer may include a metal such as Al, Cu, W, Ti, Ta, TiN, TaN, NiSi, CoSi, other suitable conductive materials, or combinations thereof. The gate electrode layer may be formed by CVD, PVD, ALD, plating, and/or other proper processes. The gate electrode layer may have a multilayer structure and may be formed in a multiple-step process. In an embodiment, the gate electrode is formed by depositing a layer of photoresist on a formed polysilicon layer by a suitable process, such as spin-on coating, and then forming a patterned photoresist feature by a proper lithography patterning method. The pattern of the photoresist can then be transferred by a dry etching process to the underlying polysilicon layer and the gate dielectric layer to pattern the gate electrode and underlying gate dielectric, in a plurality of processing steps and various proper sequences. The photoresist layer may be stripped thereafter. In another embodiment, only the gate electrode layer is patterned and the gate dielectric remains on the substrate in regions other than the gate structure.

The method 200 then proceeds to step 212 where a plurality of features are again formed on the substrate. In an embodiment, such features include a source region, a drain region, lightly doped drain/source regions, sidewall spacer elements, multilevel interconnects (MLI) including metal lines, contacts, and vias; dielectric layers (e.g., interlayer dielectric ILD), and/or other features known in the art. The source and drain may be formed by a method such as ion implantation or diffusion. A rapid thermal annealing (RTA) process may be used to activate the implanted dopant. In various embodiments, the source and drain regions may have different doping profiles formed by multi-process implantation. In one example, the MLI structure may include conductive materials such as aluminum, aluminum/silicon/copper alloy, titanium, titanium nitride, tungsten, polysilicon, metal silicide, copper, copper alloy, tantalum, tantalum nitride or combinations thereof, being referred to as aluminum interconnects. Interconnects, including MLI, may be formed by a process including chemical vapor deposition (CVD), physical vapor deposition (PVD or sputtering), plating, silicidation (including salicidation), or combinations thereof. Other manufacturing techniques to form the MLI may include photolithography processing and etching to pattern the conductive materials for vertical connection (via and contact) and horizontal connection (conductive line); chemical mechanical polish (CMP), and/or other suitable processes. The dielectric layers (e.g., silicon oxide, low k dielectric, or other suitable material) may be formed by a technique including spin-on, CVD, or other suitable processes.

Figure 3:
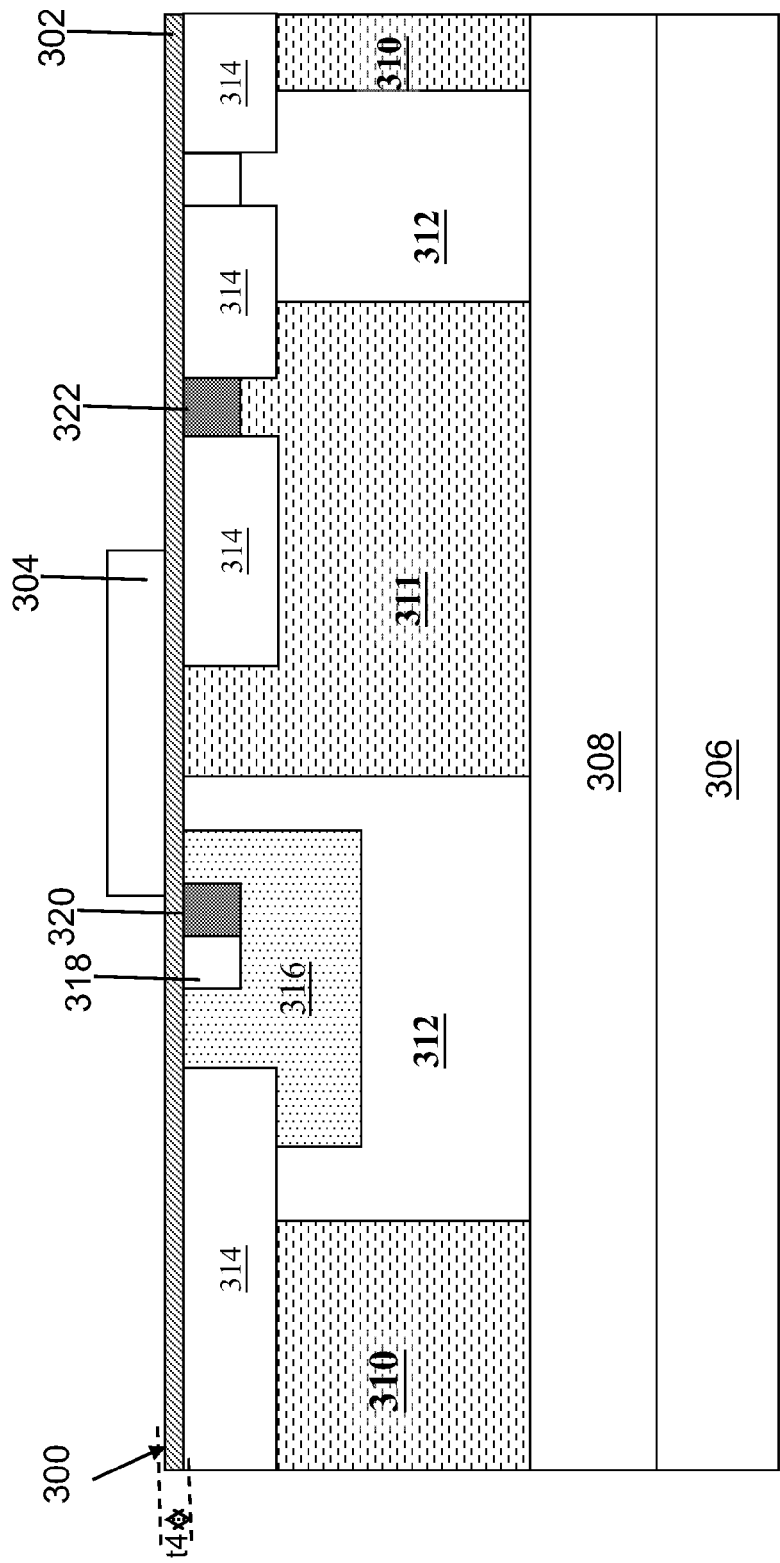
FIG. 3 is a cross-sectional view of an embodiment of a semiconductor device having a conventional gate dielectric layer.

Referring now to FIG. 3, illustrated is a high voltage metal oxide semiconductor (HVMOS) device 300. The HVMOS device 300 includes a conventional gate dielectric layer 302. The gate dielectric layer 302 is of a substantially uniform thickness t4 underlying the gate electrode 304. The HVMOS device 300 further includes a p-type substrate 306, an n-type buried layer (NBL) 308, a plurality of wells including high voltage N-wells (HVNW) 310 and 311, and high voltage P-wells (HVPW) 312. The HVNW 311 may be referred to as the drift region of the device 300. The HVMOS device 300 also includes shallow trench isolation (STI) features 314, a P-body well 316, a bulk region 318, a source region 320, and a drain region 322. One or more of the features of the device 300 may be formed using the processes described above with reference to FIG. 2.

There may be several disadvantages to the embodiment of the HVMOS device 300 illustrated in FIG. 3. For example, gate current (Ig) is a key component in influencing the reliability of the HVMOS device 300 and power devices in general. The Ig of the device 300 may be greater than desired. Lowering the maximum gate current allows for a longer hot carrier injection (HCI) lifetime for the device. Therefore, what is needed is a device structure that improves (lowers) gate current for a given voltage.

Figure 4:
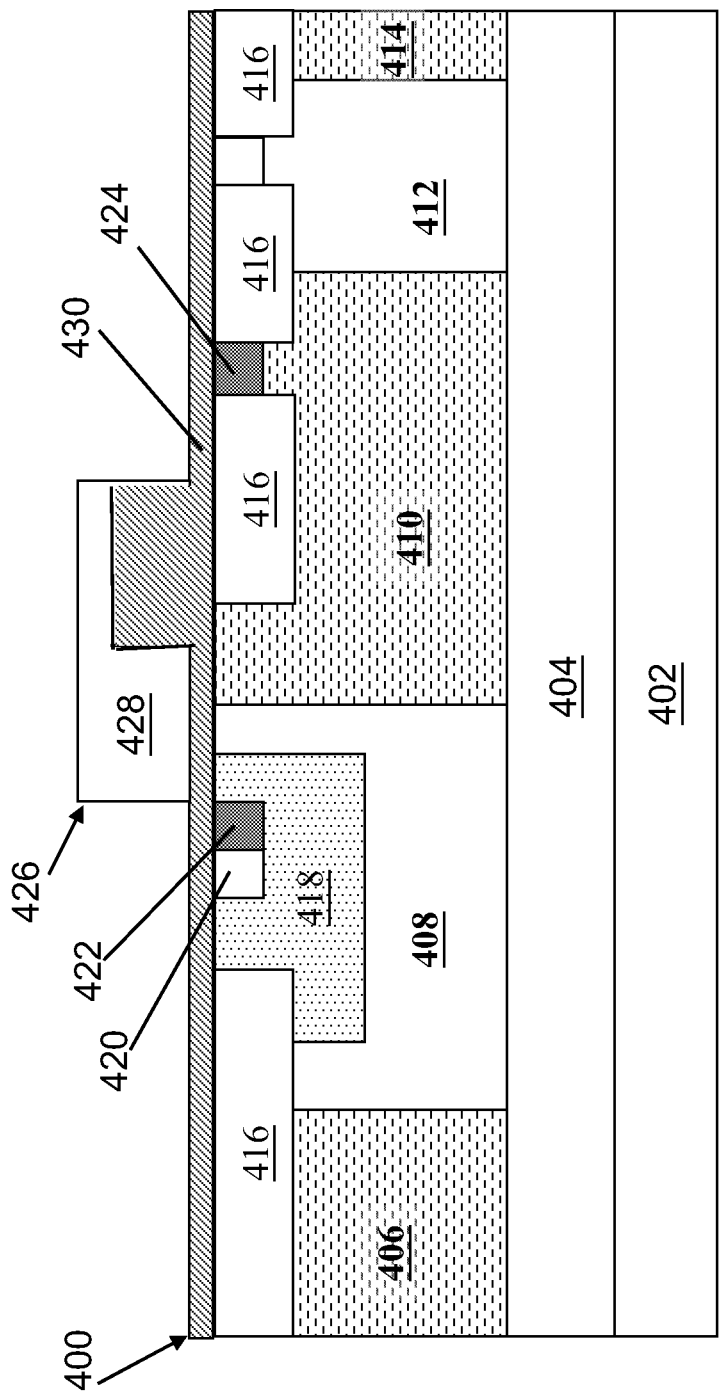
FIG. 4 is a cross-sectional view of an embodiment of a semiconductor device having a gate dielectric layer according to various aspects of the present disclosure.

Referring now to FIG. 4, illustrated is an HVMOS device 400 that benefits from one or more aspects of the present disclosure. The HVMOS device 400 may be include features substantially similar to as described above with reference to FIGS. 1 and 2. The HVMOS device 400 may be fabricated using the method 200, described above with reference to FIG. 2. The HVMOS 400 includes a substrate 402; a buried layer 404; a plurality of wells 406, 408, 410, 412, 414, and 418; shallow trench isolation (STI) structures 416; a bulk region 420; a source region 422; a drain region 424; and a gate structure 426. The gate structure 426 further includes a gate dielectric 430 and a gate electrode 428.

In an embodiment, the substrate 402 is of a first conductivity type (e.g., a p-type substrate). The substrate 402 may include a semiconductor wafer such as a silicon wafer. Alternatively, the substrate 402 may include other elementary semiconductors such as germanium. The substrate 402 may also include a compound semiconductor such as silicon carbide, gallium arsenic, indium arsenide, and indium phosphide. The substrate 402 may include an alloy semiconductor such as silicon germanium, silicon germanium carbide, gallium arsenic phosphide, and gallium indium phosphide. In one embodiment, the substrate 402 includes an epitaxial layer (epi layer) overlying a bulk semiconductor. In further embodiments, the substrate 402 may include a semiconductor-on-insulator (SOI) structure. For example, the substrate 402 may include a buried oxide (BOX) layer formed by a process such as separation by implanted oxygen (SIMOX).

The buried layer 404 is formed on and in the substrate 402. In an embodiment, the buried layer 404 is of a second type of conductivity (e.g., n-type buried layer (NBL)). The buried layer 404 may be formed by depositing photoresist, patterning the photoresist, implanting an impurity (e.g., an n-type impurity such as phosphorous, antimony or other suitable impurity) into the substrate, stripping the resist, and/or other suitable processes. Similarly, the plurality of wells 406, 408, 410, 412, 414, and 418 may be formed using photolithography and implantation processes. In an embodiment, the plurality of wells 406, 408, 410, 412, 414, and 418 are formed in an epitaxial layer of the substrate 402. In an embodiment, the wells 408 and 412 are wells of a first conductivity type (e.g., p-type wells). The wells 408 and 412 may also be referred to as high voltage wells (e.g., HV p-wells or HVPW). In an embodiment, the wells 406, 410, and 414 are wells of a second conductivity type (e.g., n-type wells). The wells 406, 410, and 414 may also be referred to as high voltage wells (e.g., HV n-wells or HVNW). The HV well 410 may equally be referred to as the drift region 410. The well 418 may be a well of a first conductivity (e.g., a p-well also termed a p-body well).

The STI structures 416 are formed on the substrate and may define and electrically isolate various active regions. The formation of an STI structure may include dry etching a trench in a substrate and filling the trench with insulator materials such as silicon oxide, silicon nitride, or silicon oxynitride. The filled trench may have a multi-layer structure such as a thermal oxide liner layer filled with silicon nitride or silicon oxide. The STI structure may be created using a processing sequence such as: forming trenches in an epitaxial layer of the substrate 402, filling the trench with dielectric material, and performing a chemical mechanical polish (CMP) to level the surface. In other embodiments, field oxide regions may be formed using local oxidation of silicon (LOCOS) processes.

The doped regions 420, 422, and 424 include the source, drain, and bulk regions of the transistor associated with the gate structure 426. The regions 420, 422, and 424 may be formed by depositing photoresist, patterning the photoresist, implanting an impurity (e.g., an n-type impurity such as phosphorous, antimony or a p-type impurity such as boron, and/or other suitable impurity) into the substrate, stripping the resist, and/or other suitable processes. The regions 420, 422, and 424 may be doped to provide suitable contact regions for the device 400. In an embodiment, the source 422 is self-aligned with the gate structure 426. In an embodiment, the drain 424 is spaced a distance from the gate structure 426 with an STI feature 416 interposing the drain 424 and the gate structure 426. Such a configuration may allow for a high drain-to-gate voltage to be applied.

The gate structure 426 includes the gate electrode 428 and the gate dielectric 430. The gate structure 426 may be configured to be coupled to metal interconnects (e.g., MLI). The gate electrode 428 may include a doped or non-doped polycrystalline silicon (or polysilicon). Alternatively, the gate electrode 428 may include a metal such as Al, Cu, W, Ti, Ta, TiN, TaN, NiSi, CoSi, other suitable conductive materials, or combinations thereof. The gate electrode 428 may be formed by chemical vapor deposition (CVD), physical vapor deposition (PVD), atomic layer deposition (ALD), plating, and/or other proper processes. Photolithography and/or etching steps may also be used to pattern the gate electrode 428.

The gate dielectric 430 may include a silicon dioxide (referred to as silicon oxide) layer. Alternatively, the gate dielectric 430 may optionally include a high-k dielectric material, silicon oxynitride, other suitable materials, or combinations thereof. The gate dielectric 430 includes multiple thicknesses. A first thickness of the gate dielectric layer may be substantially similar to as described above with reference to FIG. 3. This portion(s) of the gate dielectric 430 may also be disposed on the substrate in regions not underlying the gate electrode 428. The gate dielectric 430 may also include this first thickness (i.e., thinner portion) of the gate dielectric 430 in a region underlying the gate electrode 428. The gate dielectric 430 includes a portion having an increased thickness underlying the gate electrode 428. The increased thickness portion of the gate dielectric 430 overlies the drift region 410. The increased thickness portion also overlies the STI structure 416 adjacent the drain 424.

In an embodiment, the thicker portion of the gate dielectric 430 is between approximately 200 Angstroms and 2000 Angstroms. In an embodiment, the difference in thicknesses may range between approximately 50 Angstroms and 2000 Angstroms. In other embodiments, three or more thicknesses may be provided underlying the gate electrode 428. As illustrated in FIG. 4, the transition between the regions of differing thicknesses is a "step" transition (i.e., the thicker region has substantially vertical (normal to the surface of the substrate) sidewalls. This transition may occur at any location underlying the gate electrode 428, however may be most effective when disposed overlying the HV well 410. The positioning of the transition (e.g., the amount of dielectric of an increased thickness) may be determined based on desired device performance.

The gate dielectric 430 may be formed using chemical vapor deposition (CVD), physical vapor deposition (PVD), atomic layer deposition (ALD), thermal oxide, other suitable processes, and/or combinations thereof. The regions of differing thicknesses of the gate dielectric 430 may be defined using photolithography, etching, and/or other suitable processes to pattern the gate dielectric 430. As illustrated in FIG.

4, the dielectric material of the gate dielectric 430 extends beyond the edge of the gate electrode 428. However, other embodiments are possible.

The device of FIG. 4 may be beneficial in that the gate current (Ig) may be reduced in comparison with conventional devices. The gate dielectric layer 430 may serve to inhibit the gate current at the drift region of the device. The gate dielectric 430 may also allow for a relaxed electrical field of the drift region (HV well 410), an enhancement of breakdown voltage, reduction in gate to drain capacitance, and/or an improvement in reliability.

In an experimental embodiment, including a gate dielectric layer that provides for gate current (Ig) inhibiting (for example, a gate dielectric that includes a region of increased thickness such as illustrated in FIGS. 1, 2, and/or 4 above) provides a marked decrease in Ig. For example, in a 65V power amplifier (PA), the Ig may be lowered by an order of magnitude for a given voltage applied to the gate (e.g., $0.2\ E^{-11}$ Amps/μm for the gate dielectric inhibitor embodiment and $3.8\ E^{-11}$ Amps/μm for the conventional device).

The foregoing has outlined features of several embodiments. The disclosed structure and method may have various embodiments, modifications and variations. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A semiconductor device, comprising:
   a semiconductor substrate;
   a gate structure formed on the semiconductor substrate, wherein the gate structure includes:
      a gate dielectric having a first portion with a first thickness and a second portion with a second thickness, wherein the second thickness is greater than the first thickness; and
      a gate electrode disposed on the gate dielectric;
   a source and a drain formed in the substrate on either side of the gate structure; and
   an isolation structure in the semiconductor substrate, wherein the isolation structure underlies the second portion of the gate dielectric, wherein the gate dielectric has a different composition than an insulating material of the isolation structure.

2. The semiconductor device of claim 1, further comprising:
   a first high voltage well having a first type of conductivity;
   a second high voltage well having a second type of conductivity;
   a buried layer having the first type of conductivity, wherein the substrate has the second type of conductivity.

3. The semiconductor device of claim 2 wherein the drain is disposed in the first high voltage well, and wherein the second portion of the gate dielectric overlies the first high voltage well.

4. The semiconductor device of claim 3, wherein the first high voltage well defines a drift region.

5. The semiconductor device of claim 2, wherein the drain is disposed in the first high voltage well, and wherein the second portion of the gate dielectric overlies the first high voltage well.

6. The semiconductor device of claim 1, wherein the device is a high voltage metal oxide semiconductor (HVMOS) device.

7. The semiconductor device of claim 1, wherein the second thickness is at least 70 Å greater than the first thickness.

8. The semiconductor device of claim 1, wherein the second thickness is between approximately 200 Å and approximately 2000 Å.

9. A method of fabricating a semiconductor device, the method comprising:
   providing a semiconductor substrate;
   etching a recess in the semiconductor substrate;
   filling the recess with an insulating material to form an isolation structure;
   forming a gate dielectric layer structure on the semiconductor substrate overlying a portion of the isolation structure, wherein the forming the gate dielectric layer includes patterning the gate dielectric layer to form a first region having a first thickness and a second region having a second thickness;
   forming a gate electrode on the gate dielectric; and
   forming at least one high voltage well on the substrate underlying the gate electrode.

10. The method of claim 9, wherein the forming the gate dielectric layer includes depositing dielectric material and selectively etching a portion of the gate dielectric layer in the first region.

11. The method of claim 10, wherein the portion of the gate dielectric layer removed is between approximately 70 and approximately 2000 Angstroms.

12. The method of claim 9, wherein the gate dielectric has a different composition than an insulating material of the isolation structure.

13. A semiconductor device, comprising:
   a semiconductor substrate;
   a gate structure formed on the semiconductor substrate, wherein the gate structure includes:
      a gate dielectric having a first portion with a first thickness and a second portion with a second thickness, wherein the second thickness is greater than the first thickness; and
      a gate electrode disposed on the gate dielectric;
   a source and a drain formed in the substrate on either side of the gate structure; and
   an isolation structure in the semiconductor substrate, wherein the isolation structure underlies the second portion of the gate dielectric, wherein the isolation structure includes an insulating material filling a trench in the semiconductor substrate such that the insulating material is substantially planar with a top surface of the semiconductor substrate.

* * * * *